(12) United States Patent
Hebrard

(10) Patent No.: US 11,047,423 B2
(45) Date of Patent: Jun. 29, 2021

(54) COATED BEARING COMPONENT AND BEARING COMPRISING SUCH A COMPONENT

(71) Applicant: SKF Aerospace France S.A.S, Montigny-le-Bretonneux (FR)

(72) Inventor: Yoann Hebrard, Sarras (FR)

(73) Assignee: SKF Aerospace France S.A.S, Montigny-le-Bretonneux (FR)

( * ) Notice: Subject to any disclaimer, the term of this patent is extended or adjusted under 35 U.S.C. 154(b) by 0 days.

(21) Appl. No.: 16/149,185

(22) Filed: Oct. 2, 2018

(65) Prior Publication Data

US 2019/0178295 A1 Jun. 13, 2019

(30) Foreign Application Priority Data

Dec. 13, 2017 (DE) .......................... 102017222624.2

(51) Int. Cl.
*F16C 41/00* (2006.01)
*G01L 5/00* (2006.01)
(Continued)

(52) U.S. Cl.
CPC ............ *F16C 41/002* (2013.01); *C22C 29/16* (2013.01); *C23C 14/34* (2013.01); *F16C 19/522* (2013.01); *F16C 33/586* (2013.01); *F16C 41/00* (2013.01); *G01L 5/0019* (2013.01); *H01L 41/0805* (2013.01); *H01L 41/1132* (2013.01); *F16C 19/02* (2013.01); *F16C 2202/32* (2013.01); *F16C 2204/20* (2013.01); *F16C 2206/58* (2013.01); *F16C 2223/30* (2013.01); *F16C 2233/00* (2013.01); *F16C 2240/60* (2013.01)

(58) Field of Classification Search
CPC ...... F16C 19/04; F16C 19/522; F16C 33/586; F16C 41/00; F16C 41/002; F16C 2233/00; F16C 2240/60; F16C 2206/58; F16C 2202/32; F16C 2204/20; F16C 2233/30; F16C 19/02; C22C 29/16; G01L 5/0019; H01L 41/0805; H01L 41/1132; C23C 14/34
See application file for complete search history.

(56) References Cited

U.S. PATENT DOCUMENTS 5,221,146 A 6/1993 Maruyama
5,677,488 A * 10/1997 Monahan ................ F16C 19/30
340/682

(Continued)

FOREIGN PATENT DOCUMENTS

WO 2009097867 A1 8/2009

OTHER PUBLICATIONS

SKF, "SKF Spherical Roller Bearing" SKF Spherical Roller Bearings, May 2007.
(Continued)

*Primary Examiner* — Alan B Waits
(74) *Attorney, Agent, or Firm* — Garcia-Zamor Intellectual Property Law; Ruy Garcia-Zamor; Bryan Peckjian

(57) ABSTRACT

A coated bearing component comprising a metallic part and a coating deposited on the metallic part. The coating is a multi-layer coating having a sensor active layer made of a material having electrostrictive properties. The sensor active layer is directly coated on the metallic part. The bearing component can be integrated into a bearing.

13 Claims, 1 Drawing Sheet

(51) Int. Cl.
*C23C 14/34* (2006.01)
*C22C 29/16* (2006.01)
*H01L 41/113* (2006.01)
*F16C 33/58* (2006.01)
*F16C 19/52* (2006.01)
*H01L 41/08* (2006.01)
*F16C 19/02* (2006.01)

(56) References Cited

U.S. PATENT DOCUMENTS

| | | | | |
|---|---|---|---|---|
| 2007/0266799 | A1* | 11/2007 | Sugiura | G01L 1/16 73/862.541 |
| 2011/0204877 | A1* | 8/2011 | Eguchi | G01D 18/00 324/123 R |
| 2014/0123760 | A1* | 5/2014 | Klos | G01M 13/045 73/593 |
| 2016/0011076 | A1* | 1/2016 | Hamilton | F16C 41/004 702/34 |
| 2016/0115997 | A1 | 4/2016 | Haag et al. | |
| 2016/0187226 | A1* | 6/2016 | Tsutsui | G01M 13/045 73/593 |
| 2018/0156138 | A1* | 6/2018 | Elgezabal Gomez | F02C 9/28 |

OTHER PUBLICATIONS

Schaeffler Technologies GmbH & Co. KG, "The Design of Rolling Bearings"FAG The design of rolling bearings, Jul. 2011.

DIN German Institute for Standardization e.V., "Roiling Bearings—Radial spherical roller bearings—Part 2: Double row, cylindrical and tapered bore" DIN German Institute for Standardization e,V., Jan. 2009.

Attempts for Real Time Sensing in Tribo Contacts—Ways to Digital Tribology, MENSUS Session, Schaeffler Prof. Dr. W. Holweger, Walter.holweger@schaeffler.com, Oct. 11, 2016.

* cited by examiner

COATED BEARING COMPONENT AND BEARING COMPRISING SUCH A COMPONENT

CROSS-REFERENCE TO RELATED APPLICATIONS

This application claims priority to German Patent Application no. 102017222624.2 filed on Dec. 13, 2017, the contents of which are fully incorporated herein by reference.

TECHNOLOGICAL FIELD OF THE PRESENT INVENTION

The present invention relates to a field of rolling bearings, and more particularly to the field of sensors for measuring relevant parameters for a rolling bearing, such as, for example, bearing loads and strains, vibration, acceleration, and lubricant thickness.

BACKGROUND

It is known to use strain sensors, such as foil strain gauge, piezoelectric ceramic wafer, or optical sensors, mounted inside a groove machined on a rolling bearing part and secured with a bond layer.

However, such groove has an impact on the part of the rolling bearing on which it is machined and the bond layer alter the transducing capability of the sensor by adding a shear lag effect.

Furthermore, sensors used in rolling bearings are limited due to dimensional constraints of the rolling bearing.

The use of piezoelectric sensors is particularly interesting since those sensors are able to sense a large number of relevant parameters for rolling bearing. However, current piezoelectric sensors are made of brittle ceramic wafer that cannot be bond to a bearing part without machining a flat surface.

Document US 2016/0115997 A1 discloses a rolling bearing part coated with a wear protective layer made of chromium and deposited in a gas phase deposition (PVD) process.

However, the aim of such coating is to protect against wear and has no sensing effect.

BRIEF SUMMARY OF THE PRESENT INVENTION

The aim of the present invention is to provide a low intrusive and high sensitivity sensor for a rolling bearing capable of measuring strains, loads, vibrations, as well as lubricant thickness.

It is a particular object of the present invention to provide a coated bearing component comprising a metallic part and a coating deposited on the part.

The coating is a multi-layer coating having a sensor active layer made of a material having electrostrictive properties, the sensor active layer being directly coated on the metallic part.

Electrostriction is a property of electrical non-conductor materials having their shape changing under application of an electrical field. Generally, electrostriction is defined as a quadratic coupling between the strain and the polarization.

Thanks to a thin layer of a sensor active layer having electrostrictive properties directly integrated to a component or part of a bearing, the coating acts as a pseudo-piezoelectric sensor which is low intrusive and has a high sensitivity capable of measuring strains, loads, vibrations, as well as lubricant thickness.

The sensor active layer is, for example, made of aluminum nitride.

Advantageously, the multi-layer coating comprises, successively on the sensor active layer, an electrode layer, an isolation layer and a wear layer.

The electrode layer is, for example, connected by a wire to a direct current (DC), while the coated bearing component is connected to a ground wire.

The sensor active layer is subjected to a direct current DC biased electrical field. Since the material of the sensor active layer is not piezoelectric, it is necessary to induce polarization with this direct current DC biased electrical field in order to obtain a pseudo-piezoelectric behavior. This pseudo-piezoelectric effect provides access to piezoelectric measuring capacities, such as vibration measurements and strain measurements without the need to control polarization growth during the service life of the rolling bearing. The polarization is a single step in the process to build the sensor.

The multi-layer coating is advantageously deposited on the metallic part using a sputtered coating method.

Other techniques may be used to deposit the multi-layer coating on the metallic part, such as, for example, physical vapor deposition (PVD) process, chemical vapor deposition (CVD) process, dipping methods, casting, spray coating and/or spin coating.

The multi-layer coating is thus not bonded but deposited on the bearing component using particular depositing method, such that shear lag effect is avoided.

The coating has, for example, a thickness comprised between 3 μm and 5 μm, for example equal to 4 μm.

The sensor active layer may have usable bandwidth comprised between 20 MHz and 350 MHz.

According to another aspect, the invention relates to a bearing comprising at least an inner ring and an outer ring, wherein at least a portion of at least one of the rings is the coated bearing component as described above.

For example, at least a portion of the outer cylindrical surface of the outer ring is coated with the multi-layer coating and at least the sensor active layer overlaps on a lateral surface of the outer ring.

Alternatively, the electrode layer and the isolation layer may also overlap on a lateral surface of the outer ring.

The coated component may be part of a rolling bearing having a row of rolling elements arranged between the inner and outer rings and a cage retaining the rolling elements, or a plain or solid bearing.

Alternatively, the coating may be deposited on any another component of a bearing, for example the inner ring, the cage or the rolling elements in case of a rolling bearing.

One of the component forms the metallic part for the coating.

BRIEF DESCRIPTION OF THE DRAWINGS

The present invention and its advantages will be better understood by studying the detailed description of specific embodiments given by way of non-limiting examples and illustrated by the appended drawings on which.

DETAILED DESCRIPTION OF THE PRESENT INVENTION

Figure 1:
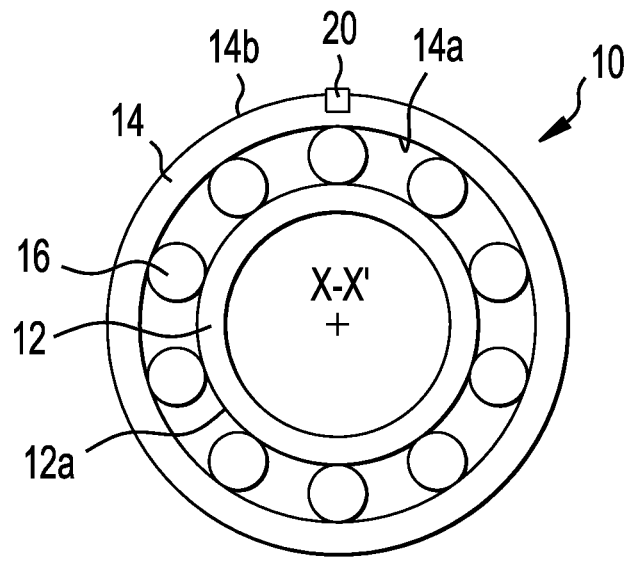
FIG. 1 presents a schematic view of an exemplary rolling bearing in accordance with an embodiment of the invention having a coating.

In the further description, terms "outer" and inner" are defined with respect to the rotational axis X-X' of the rolling bearing illustrated on FIG. 1, where the term "inner" means closer to the rotational axis X-X' of the rolling bearing then term "outer".

Referring first to FIG. 1, which illustrates an embodiment of a rolling bearing 10 according to the invention; the bearing comprises an inner ring 12, an outer ring 14, a row of rolling elements 16 consisting, in the example illustrated, of balls, held by a cage (not shown on the Figures) between the inner ring 12 and the outer ring 14.

The inner ring 12 and the outer ring 14 are both solid and have a toroidal groove (not depicted) provided respectively on its outer cylindrical surface 12a and inner cylindrical surface 14a and forming a raceway for the rolling elements 16. The radius of curvature of the groove is slightly greater than the radius of the rolling elements 16.

The inner ring 12 and the outer ring 14 are made of metallic material.

The inner and outer rings 12, 14 may be manufactured by machining or by pressing a steel blank which is then ground and optionally lapped at the raceway in order to give the rings their geometric characteristics and its final surface finish.

As shown on the Figures, a portion of the outer cylindrical surface 14b of the outer ring 14 is coated with a multi-layer coating 20 acting as a piezoelectric sensor. The portion of the cylindrical surface 14b forms the metallic part for the coating 20.

Alternatively, it is possible to coat another component of the rolling bearing 10, for example the inner cylindrical surface of the outer ring 14, one of the cylindrical surfaces of the inner ring, the cage or any other component of the rolling bearing.

The multi-layer coating 20 comprises successive layers of a sensor active layer 22, an electrode layer 24, an isolation layer 26 and a wear layer 28.

Figure 2:
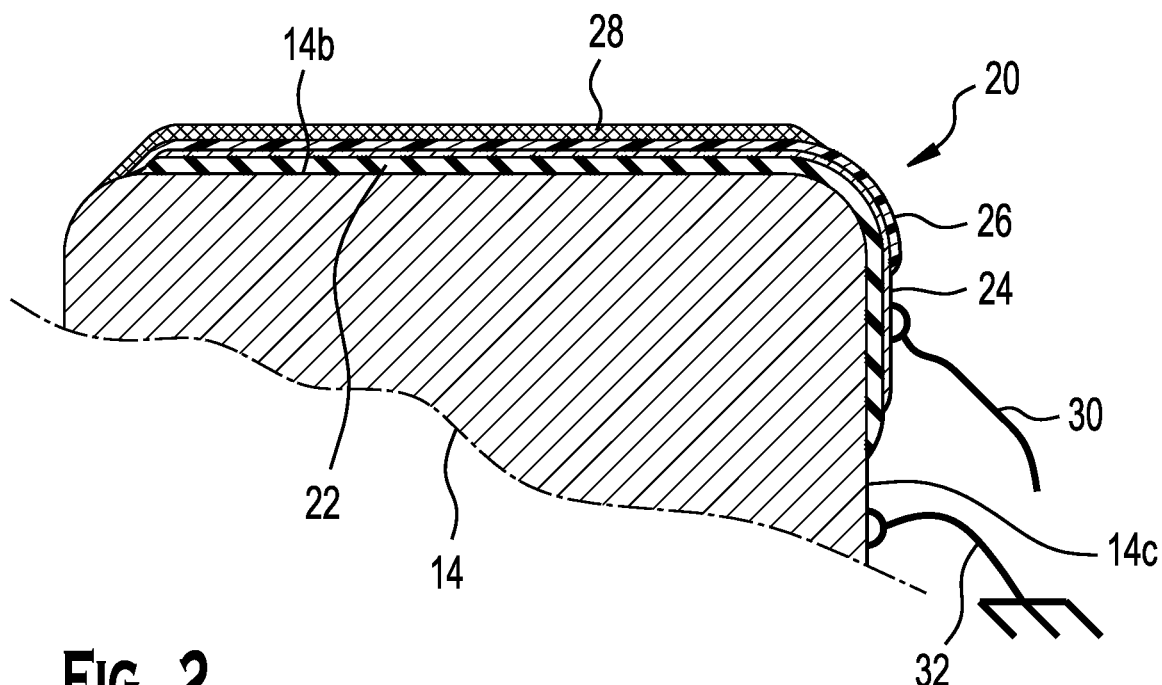
FIG. 2 presents a schematic cross section of the coating of the rolling bearing of FIG. 1.

As shown on FIG. 2, the sensor active layer 22, the electrode layer 24 and the isolation layer 26 overlap on a lateral surface 14b of the outer ring 14.

The electrode layer 24 is connected by a wire 30 to a direct current DC, while the outer ring 14 is connected to a ground wire 32.

The sensor active layer 22 is made of a material having electrostrictive properties, such as for example aluminum nitride, zinc oxide, or any other material having electrostrictive properties.

Electrostriction is a property of electrical non-conductor materials having their shape changing under application of an electrical field. Generally, electrostriction is defined as a quadratic coupling between the strain and the polarization.

The sensor active layer 22 is subjected to a direct current DC biased electrical field. Since the material of the sensor active layer is not piezoelectric, it is necessary to induce polarization with this direct current DC biased electrical field in order to obtain a pseudo-piezoelectric behavior. This pseudo-piezoelectric effect provides access to piezoelectric measuring capacities, such as vibration measurements and strain measurements without the need to control polarization growth during the service life of the rolling bearing.

The polarization is a single step in the process to build the sensor.

Conventional techniques for thin film deposition may be used for depositing the multi-layer coating 20 on the rolling bearing component, such as physical vapor deposition (PVD) process, chemical vapor deposition (CVD) process, dipping methods, casting, spray coating and/or spin coating.

Preferably, the multi-layer coating 20 is deposited on the rolling bearing component using a thin (around 4 µm) sputtered coating method.

The sensor active layer 22 has a usable bandwidth comprised between 20 MHz and 350 MHz.

The invention is not limited to a rolling bearing and may be applied to a plain or solid bearing.

As one result of the present invention, a thin layer of a sensor active layer having electrostrictive properties is directly integrated to a component or part of the rolling bearing providing a coating acting as a pseudo-piezoelectric sensor which is low intrusive and has a high sensitivity capable of measuring strains, loads, vibrations, as well as lubricant thickness.

Furthermore, the multi-layer coating is not bonded but deposited on the rolling bearing component using particular depositing method, such that shear lag effect is avoided.

As another result of the present invention, the integration of the sensor is improved in comparison to current method which needs gluing/soldering, compensating the low sensing material performance.

Finally, the sensitivity of such multi-layer coating 20 is adjustable by adjusting the biased electrical field.

What is claimed is:

1. A coated bearing component, comprising:
  an outer ring of a bearing, the outer ring being formed of metallic material, the outer ring having an outermost radial surface formed by an axially extending radial surface, the outer ring having an axial end defining a radially extending axial surface
  a coating deposited on outer ring, wherein, when the coated bearing component is viewed in cross section, the coating is a multi-layer coating comprising:
    a sensor active layer made of a material having electrostrictive properties, wherein the sensor active layer is positioned on the axially extending radial surface and the radially extending axial surface of the outer ring, the sensor active layer having first and second sensor layer axial ends, the second sensor layer axial end being located on the radially extending axial surface,
    an electrode layer located on the sensor active layer and having first and second electrode layer axial ends, the second electrode layer axial end being located along a portion of the sensor active layer that overlies the radially extending axial surface,
    an isolation layer having first and second isolation layer axial ends, the isolation layer being located on the electrode layer and the second isolation layer axial end being located over the axially extending radial surface, and
    a wear layer located on the isolation layer and having first and second wear layer axial ends, the second wear layer axial end being located over the axially extending radial surface of the outer ring,
  wherein the first sensor layer axial end, the first isolation layer axial end, and the first wear layer axial end each contact the axially extending radial surface of the outer ring, the isolation layer and the wear layer being configured to prevent the first electrode layer axial end from contacting the axially extending radial surface of the outer ring.

2. The coated bearing component according to claim 1, wherein a sensitivity of the coating is adjustable by adjusting a strength of the direct current biased electrical field.

3. The coated bearing component according to claim 1, wherein the electrode layer is connected by a wire to a direct current (DC), while the coated bearing component is connected to a ground wire.

4. The coated bearing component according to claim 1, wherein the multi-layer coating is deposited on the metallic part using a sputtered coating method.

5. The coated bearing component according to claim 1, wherein the coating has a thickness comprised between three micrometers (3 μm) and five micrometers (5 μm).

6. The coated bearing component according to claim 1, wherein the coating has a thickness that is substantially equal to four micrometers (4 μm).

7. The coated bearing component according to claim 1, wherein the sensor active layer has a usable bandwidth comprised between twenty megahertz (20 MHz) and three hundred fifty megahertz (350 MHz).

8. A coated bearing component, comprising:
   an outer ring of a bearing, the outer ring being formed of metallic material, the outer ring having an outermost radial surface formed by an axially extending radial surface, the outer ring having an axial end defining a radially extending axial surface
   a coating deposited on outer ring, wherein, when the coated bearing component is viewed in cross section, the coating is a multi-layer coating comprising:
      a sensor active layer made of a material having electrostrictive properties, wherein the sensor active layer is positioned on the axially extending radial surface and the radially extending axial surface of the outer ring, the sensor active layer having first and second sensor layer axial ends, the second sensor layer axial end being located on the radially extending axial surface,
      an electrode layer located on the sensor active layer and having first and second electrode layer axial ends, the second electrode layer axial end being located along a portion of the sensor active layer that overlies the radially extending axial surface,
      an isolation layer having first and second isolation layer axial ends, the isolation layer being located on the electrode layer and the second isolation layer axial end being located over the axially extending radial surface, and
      a wear layer located on the isolation layer and having first and second wear layer axial ends, the second wear layer axial end being located over the axially extending radial surface of the outer ring,
      wherein the first sensor layer axial end, the first isolation layer axial end, and the first wear layer axial end each contact the axially extending radial surface of the outer ring, the isolation layer and the wear layer being configured to prevent the first electrode layer axial end from contacting the axially extending radial surface of the outer ring,
   a wire connected to the electrode layer and configured to supply a direct current thereto to create a direct current DC biased electrical field, power source, wherein a sensitivity of the coating is adjustable by adjusting a strength of the direct current biased electrical field.

9. The coated bearing component according to claim 8, wherein the coated bearing component is connected to a ground wire.

10. The coated bearing component according to claim 8, wherein the multi-layer coating is deposited on the metallic part using a sputtered coating method.

11. The coated bearing component according to claim 8, wherein the coating has a thickness comprised between three micrometers (3 μm) and five micrometers (5 μm).

12. The coated bearing component according to claim 8, wherein the coating has a thickness that is substantially equal to four micrometers (4 μm).

13. The coated bearing component according to claim 8, wherein the sensor active layer has a usable bandwidth comprised between twenty megahertz (20 MHz) and three hundred fifty megahertz (350 MHz).

* * * * *